United States Patent
Ai (10) Patent No.: US 12,092,497 B2
(45) Date of Patent: Sep. 17, 2024

(54) METHOD FOR UPDATING CAPACITANCE REFERENCE, CHIP, AND CAPACITANCE DETECTION APPARATUS

(71) Applicant: SHENZHEN GOODIX TECHNOLOGY CO., LTD., Shezhen (CN)

(72) Inventor: Juan Ai, Shenzhen (CN)

(73) Assignee: SHENZHEN GOODIX TECHNOLOGY CO., LTD. (CN)

( * ) Notice: Subject to any disclaimer, the term of this patent is extended or adjusted under 35 U.S.C. 154(b) by 417 days.

(21) Appl. No.: 17/695,351

(22) Filed: Mar. 15, 2022

(65) Prior Publication Data

US 2022/0260393 A1    Aug. 18, 2022

Related U.S. Application Data

(63) Continuation of application No. PCT/CN2021/075882, filed on Feb. 7, 2021.

(51) Int. Cl.
 *G01D 5/24*    (2006.01)
(52) U.S. Cl.
 CPC .................................. *G01D 5/2403* (2021.05)
(58) Field of Classification Search
 CPC ............... H03K 17/955; H03K 17/962; H03K 2217/94031; G01D 5/2403
 See application file for complete search history.

(56) References Cited

U.S. PATENT DOCUMENTS

| | | | |
|---|---|---|---|
| 2004/0233946 A1 | 11/2004 | Moto | |
| 2009/0059981 A1 | 3/2009 | Mizusako et al. | |
| 2017/0102800 A1* | 4/2017 | Ramakrishnan | ........ G06F 3/044 |
| 2019/0312407 A1 | 10/2019 | Halbritter et al. | |
| 2020/0133412 A1 | 4/2020 | Kuan et al. | |

FOREIGN PATENT DOCUMENTS

| | | |
|---|---|---|
| CN | 101963873 A | 2/2011 |
| CN | 102855032 A | 1/2013 |
| CN | 102855032 B | 3/2016 |

(Continued)

*Primary Examiner* — Yaron Cohen
(74) *Attorney, Agent, or Firm* — Emerson, Thomson & Bennett, LLC; Roger D. Emerson; Matt J. Wilson (57) ABSTRACT

Embodiments of the present disclosure provide a method for updating a capacitance reference, which includes: determining, based on an n-th frame of raw capacitance data and an (n−M)-th frame of raw capacitance data outputted from the capacitance detection apparatus, a feature value corresponding to the n-th frame of raw capacitance data; computing a difference value between the n-th frame of raw capacitance data and a reference value corresponding to an (n−1)-th frame of raw capacitance data outputted from the capacitance detection apparatus, to obtain a capacitance variation; and determining, when the feature value corresponding to the n-th frame of raw capacitance data is less than a first threshold $Thr_1$, and the capacitance variation is less than a proximity threshold $Thr_{on}$, the n-th frame of raw capacitance data or the (n−1)-th frame of raw capacitance data as a reference value corresponding to the n-th frame of raw capacitance data.

20 Claims, 4 Drawing Sheets

(56) References Cited

FOREIGN PATENT DOCUMENTS

| CN | 107636582 | A | 1/2018 |
|---|---|---|---|
| CN | 109238314 | A | 1/2019 |
| CN | 109601015 | A | 4/2019 |
| CN | 111190507 | A | 5/2020 |
| DE | 202006005148 | U1 | 8/2007 |

* cited by examiner

METHOD FOR UPDATING CAPACITANCE REFERENCE, CHIP, AND CAPACITANCE DETECTION APPARATUS

TECHNICAL FIELD

Embodiments of the present disclosure relate to the technical field of capacitance detection, and in particular to a method for updating a capacitance reference, a chip, and a capacitance detection apparatus.

BACKGROUND

Figure 1:
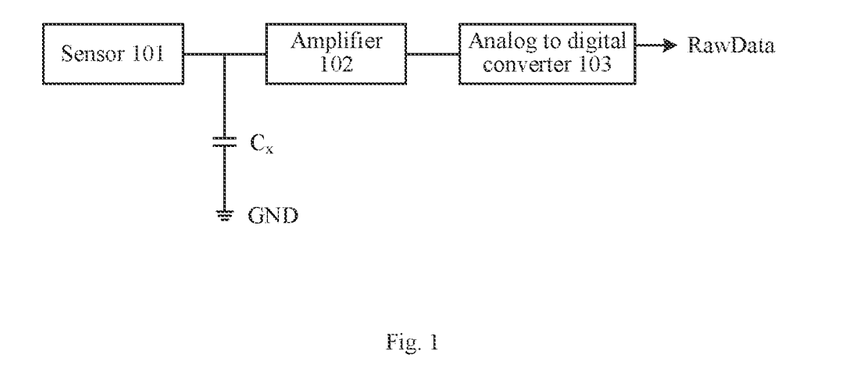
FIG. 1 is a schematic structural diagram of a typical capacitance detection apparatus.

A capacitance detection apparatus can identify whether a human body or other conductors are approaching based on a capacitance value variation. FIG. 1 shows a schematic structural diagram of a typical capacitance detection apparatus. The capacitance detection apparatus includes: a sensor 101, an amplifier (AMP) 102, and an analog to digital converter (ADC) 103. When a human body or other conductors are approaching, a capacitance value of a capacitor Cx of the sensor 101 to the system ground GND will vary. The sensor 101 may output a detected capacitance signal to the amplifier 102, to input an amplified capacitance signal to the analog to digital converter 103, thereby obtaining a raw capacitance signal RawData. A difference value between the raw capacitance signal RawData and a reference signal Ref may be computed to obtain a capacitance variation signal Diff; and a signal value of the capacitance variation signal Diff may be compared with a preset threshold to identify whether a human body or other conductors are approaching or moving away from the capacitance detection apparatus. The reference signal Ref is a signal outputted from the capacitance detection apparatus when there is no additional input from a human body or other conductors.

Figure 2:
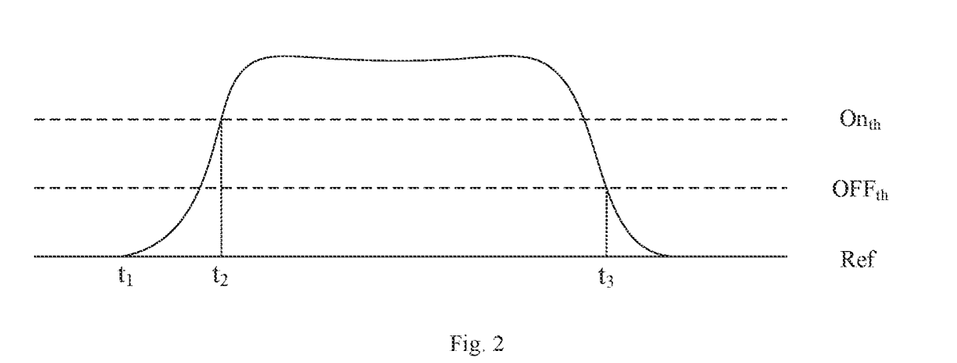
FIG. 2 is a schematic fluctuation diagram of a raw capacitance signal RawData outputted from the capacitance detection apparatus shown in FIG. 1.

FIG. 2 shows a schematic fluctuation diagram of a raw capacitance signal RawData outputted from the above typical capacitance detection apparatus; as can be seen therefrom, at a moment t1, a signal value of the raw capacitance signal RawData is equal to a signal value of a reference signal Ref, indicating that no human body or other conductors are approaching the capacitance detection apparatus; at a moment t2, a signal value of the raw capacitance signal RawData reaches a proximity threshold $ON_{th}$, indicating that a human body or other conductors have approached the capacitance detection apparatus; and at a moment t3, the signal value of the raw capacitance signal RawData decreases to an off threshold $OFF_{th}$, indicating that the human body or other conductors are moving away from the capacitance detection apparatus.

However, in a practical application, factors such as an ambient temperature or noise interference will cause reference drift. Therefore, if the signal value of the reference signal Ref is not updated in real time, a signal value of a capacitance variation signal Diff will tend to deviate from a capacitance variation with respect to an actual operation, thus further resulting in misrecognition or missed recognition of an event. The event includes: a human body or other conductors approach the capacitance detection apparatus, or a human body or other conductors move away from the capacitance detection apparatus.

In the prior art, a common reference updating method is first-order hysteresis filtering, which may be described by an equation below:

$$Ref(n) = Coef_x * Ref(n-1) + (1 - Coef_x) * RawData(n)$$

Ref(n) is a current n-th frame of reference value of the reference signal Ref, Ref(n−1) is an (n−1)-th frame of reference value of the reference signal Ref, RawData(n) is the current n-th frame of raw capacitance data of the raw capacitance signal RawData, and $Coef_x$ is a filter coefficient. The size of the filter coefficient $Coef_x$ can affect smoothness and delayed response of the Ref(n), and the size of the filter coefficient $Coef_x$ is adjusted such that the higher the smoothness is, the greater the delayed response is; and the smaller the delayed response is, the lower the smoothness is.

The reference updating method weighs current sampled RawData(n) and last outputted Ref(n−1), to update partial data of the raw capacitance signal RawData to a new reference signal Ref. However, this method will partially update both valid data and noise in the raw capacitance signal RawData to the reference signal Ref, resulting in noise jitter in the computed capacitance variation signal Diff. If it is intended to reduce jitter of the reference signal Ref, greater delayed response will be caused. Therefore, the above reference updating method is difficult to be adapted to an application scenario that is more sensitive to noise interference and delayed response.

SUMMARY

Embodiments of the present disclosure provide a method for updating a capacitance reference, a chip, and a capacitance detection apparatus, for effectively updating the capacitance reference value in real time, and reducing the impacts of noise jitter and delayed response on the capacitance detection performance.

In a first aspect, an embodiment of the present disclosure provides a method for updating a capacitance reference. The method is applied to a capacitance detection apparatus, and includes:

determining, based on an n-th frame of raw capacitance data RawData(n) and an (n−M)-th frame of raw capacitance data RawData(n−M) outputted from the capacitance detection apparatus, a feature value Feature(n) corresponding to the n-th frame of raw capacitance data; where the feature value Feature(n) corresponding to the n-th frame of raw capacitance data is used for indicating a different stage in a process of a conductor approaching or moving away from the capacitance detection apparatus;

computing a difference value between the n-th frame of raw capacitance data RawData(n) and a reference value Ref(n−1) corresponding to an (n−1)-th frame of raw capacitance data outputted from the capacitance detection apparatus, to obtain a capacitance variation Diff(n); and determining, when the feature value Feature(n) corresponding to the n-th frame of raw capacitance data is less than a first threshold $Thr_1$, and the capacitance variation Diff(n) is less than a proximity threshold $Thr_{on}$, the n-th frame of raw capacitance data RawData(n) or the (n−1)-th frame of raw capacitance data RawData(n−1) as a reference value Ref(n) corresponding to the n-th frame of raw capacitance data; where the proximity threshold $Thr_{on}$ is used for determining whether the conductor has approached the capacitance detection apparatus; and the first threshold $Thr_1$ is used for determining whether there is an additional input from the conductor on the capacitance detection apparatus;

where n is a positive integer greater than 2, M is a positive integer greater than or equal to 1, and M<n.

The feature value Feature(n) corresponding to the n-th frame of raw capacitance data is set based on the n-th frame of raw capacitance data RawData(n) and the (n−M)-th frame of raw capacitance data RawData(n−M); and the size of the feature value Feature(n) is compared with the size of the first threshold, thereby determining whether there is an additional input from a human body or other conductors on the capacitance detection apparatus. When the feature value Feature(n) corresponding to the n-th frame of raw capacitance data of is less than the first threshold $Thr_1$, and the capacitance variation Diff(n) is less than the proximity threshold $Thr_{on}$, it means that there is no additional input from a human body or other conductors on the capacitance detection apparatus, i.e., the capacitance detection apparatus is in an empty state. In this stage, the reference value Ref(n) corresponding to the n-th frame of raw capacitance data is set to be equal to the n-th frame of raw capacitance data RawData(n) or the (n−1)-th frame of raw capacitance data RawData(n−1), thereby offsetting partial noise in a capacitance variation signal Diff, enabling the capacitance variation signal Diff to track the fluctuations of the raw capacitance signal RawData in real time, and reducing the impacts of noise jitter and delayed response on the capacitance detection performance.

Alternatively, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data is determined based on the reference value Ref(n−1) corresponding to the (n−1)-th frame of raw capacitance data.

Alternatively, when the feature value Feature(n) corresponding to the n-th frame of raw capacitance data is greater than or equal to a second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data is determined based on the feature value Feature(n) corresponding to the n-th frame of raw capacitance data, a feature value Feature(n−1) corresponding to the (n−1)-th frame of raw capacitance data, the reference value Ref(n−1) corresponding to the (n−1)-th frame of raw capacitance data, and a reference value Ref(n−2) corresponding to an (n−2)-th frame of raw capacitance data outputted from the capacitance detection apparatus; where the second threshold $Thr_2$ is used for determining whether the conductor is gradually disconnected from contact with the capacitance detection apparatus;

where the second threshold $Thr_2$ is less than the first threshold $Thr_1$.

Alternatively, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data is determined based on the reference value Ref(n−1) corresponding to the (n−1)-th frame of raw capacitance data.

Alternatively, the determining, based on the n-th frame of raw capacitance data RawData(n) and the (n−M)-th frame of raw capacitance data RawData(n−M) outputted from the capacitance detection apparatus, the feature value Feature(n) corresponding to the n-th frame of raw capacitance data further includes:

determining a difference value between the n-th frame of raw capacitance data RawData(n) and the (n−M)-th frame of raw capacitance data RawData(n−M) as the feature value Feature(n) corresponding to the n-th frame of raw capacitance data.

Alternatively, the determining, when the feature value Feature(n) corresponding to the n-th frame of raw capacitance data is less than the first threshold $Thr_1$, and the capacitance variation Diff(n) is less than the proximity threshold $Thr_{on}$, the n-th frame of raw capacitance data RawData(n) or the (n−1)-th frame of raw capacitance data RawData(n−1) as the reference value Ref(n) corresponding to the n-th frame of raw capacitance data further includes:

determining a minimum value of the n-th frame of raw capacitance data RawData(n) and the (n−1)-th frame of raw capacitance data RawData(n−1) as the reference value Ref(n) corresponding to the n-th frame of raw capacitance data.

Alternatively, the determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data further includes:

determining, when the feature value Feature(n) corresponding to the n-th frame of raw capacitance data is greater than or equal to the first threshold $Thr_1$, and is less than a third threshold $Thr_3$, and the capacitance variation Diff(n) is less than the proximity threshold $Thr_{on}$, a sum of the reference value Ref(n−1) corresponding to the (n−1)-th frame of raw capacitance data and a first correction value $Corr_1$ as the reference value Ref(n) corresponding to the n-th frame of raw capacitance data;

determining, when the feature value Feature(n) corresponding to the n-th frame of raw capacitance data is greater than or equal to the third threshold $Thr_3$, and the capacitance variation Diff(n) is less than the proximity threshold $Thr_{on}$, a sum of the reference value Ref(n−1) corresponding to the (n−1)-th frame of raw capacitance data and a second correction value $Corr_2$ as the reference value Ref(n) corresponding to the n-th frame of raw capacitance data; where the third threshold $Thr_3$ is used for determining an extent to which the conductor is approaching the capacitance detection apparatus; and the first correction value $Corr_1$ and the second correction value $Corr_2$ are used for characterizing an offset of a reference value caused by an environmental factor in a corresponding stage, respectively;

where the third threshold $Thr_3$ is greater than the first threshold $Thr_1$.

Alternatively, the determining, when the feature value Feature(n) corresponding to the n-th frame of raw capacitance data is greater than or equal to the second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, the feature value Feature(n−1) corresponding to the (n−1)-th frame of raw capacitance data, the reference value Ref(n−1) corresponding to the (n−1)-th frame of raw capacitance data, and the reference value Ref(n−2) corresponding to the (n−2)-th frame of raw capacitance data outputted from the capacitance detection apparatus further includes:

computing a difference value between the feature value Feature(n) corresponding to the n-th frame of raw capacitance data and the feature value Feature(n−1) corresponding to the (n−1)-th frame of raw capacitance data, to obtain a first variation Diff_Feature(n);

computing a difference value between the reference value Ref(n−1) corresponding to the (n−1)-th frame of raw capacitance data and the reference value Ref(n−2) corresponding to the (n−2)-th frame of raw capacitance data, to obtain a second variation Diff-Ref(n−1); and enabling the reference value Ref(n) corresponding to the n-th frame of raw capacitance data to satisfy an equation below:

$$Ref(n) = \left(\frac{\text{Diff\_Feature}(n)}{\text{Feature}(n-1)} + 1\right) * \text{Diff\_Ref}(n-1).$$

A value of the second variation Diff_Ref(n−1) is not zero.

Alternatively, the determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data further includes:

determining, when the feature value Feature(n) corresponding to the n-th frame of raw capacitance data is greater than the first threshold $Thr_1$, and the capacitance variation Diff(n) is greater than or equal to the proximity threshold $Thr_{on}$, the sum of the reference value Ref(n−1) corresponding to the (n−1)-th frame of raw capacitance data and the second correction value $Corr_2$ as the reference value Ref(n) corresponding to the n-th frame of raw capacitance data; and determining, when the feature value Feature(n) corresponding to the n-th frame of raw capacitance data is less than the second threshold $Thr_2$, and the capacitance variation Diff(n) is greater than or equal to the proximity threshold $Thr_{on}$, a sum of the reference value Ref(n−1) corresponding to the (n−1)-th frame of raw capacitance data and a third correction value $Corr_3$ as the reference value Ref(n) corresponding to the n-th frame of raw capacitance data;

where the third correction value $Corr_3$ is used for characterizing an offset of a reference value caused by an environmental factor in a corresponding stage.

In a second aspect, an embodiment of the present disclosure provides a chip, including a processor and a memory, where the memory is coupled to the processor;

the memory is configured to store computer program instructions; and the processor is configured to invoke the computer program instructions stored in the memory, such that the chip executes the method for updating a capacitance reference according to the first aspect or any one alternative implementation in the first aspect.

In a third aspect, an embodiment of the present disclosure provides a capacitance detection apparatus, including the chip according to the second aspect.

In a fourth aspect, an embodiment of the present disclosure provides a computer readable storage medium configured to store a computer program, where the computer program causes a computer to execute the method for updating a capacitance reference according to the first aspect or any one alternative implementation in the first aspect.

It is understandable that the chip according to the second aspect, the capacitance detection apparatus according to the third aspect, and the computer readable storage medium according to the fourth aspect provided above are all configured to execute the corresponding method provided above, and therefore, the beneficial effects in the corresponding methods provided above may be referred to for the beneficial effects to be achieved whereby. The description will not be repeated here.

BRIEF DESCRIPTION OF THE DRAWINGS

One or more embodiments are illustrated with reference to the pictures in the corresponding drawings, but these illustrations do not constitute a limitation on the embodiments. In addition, unless otherwise particularly stated, the figures in the accompanying drawings do not constitute a limitation of scale.

DETAILED DESCRIPTION OF EMBODIMENTS

The technical solutions in embodiments of the present disclosure will be clearly and completely described below with reference to the accompanying drawings. Apparently, the embodiments described below are a part, instead of all, of the embodiments of the present disclosure.

The terms used in the present disclosure are intended merely to describe particular embodiments, and are not intended to limit the present disclosure. The singular forms of "a" and "the" used in the present disclosure and the appended claims are also intended to include plural forms, unless the context clearly indicates other meanings.

It should also be understood that unless a specified order is clearly stated in the context of the present disclosure, the processing steps described herein may be performed differently from the specified order. That is, each step may be performed in the specified order, or each step may be performed substantially simultaneously, each step may be performed in a reverse order, or each step may be performed in a different order.

In addition, the terms such as "first" and "second" are only used for distinguishing between similar objects, and cannot be understood as indicating or implying relative importance or implicitly indicating the number of indicated technical features. Thus, features defined with "first," "second," or the like may explicitly or implicitly include one or more of the features.

Figure 3:
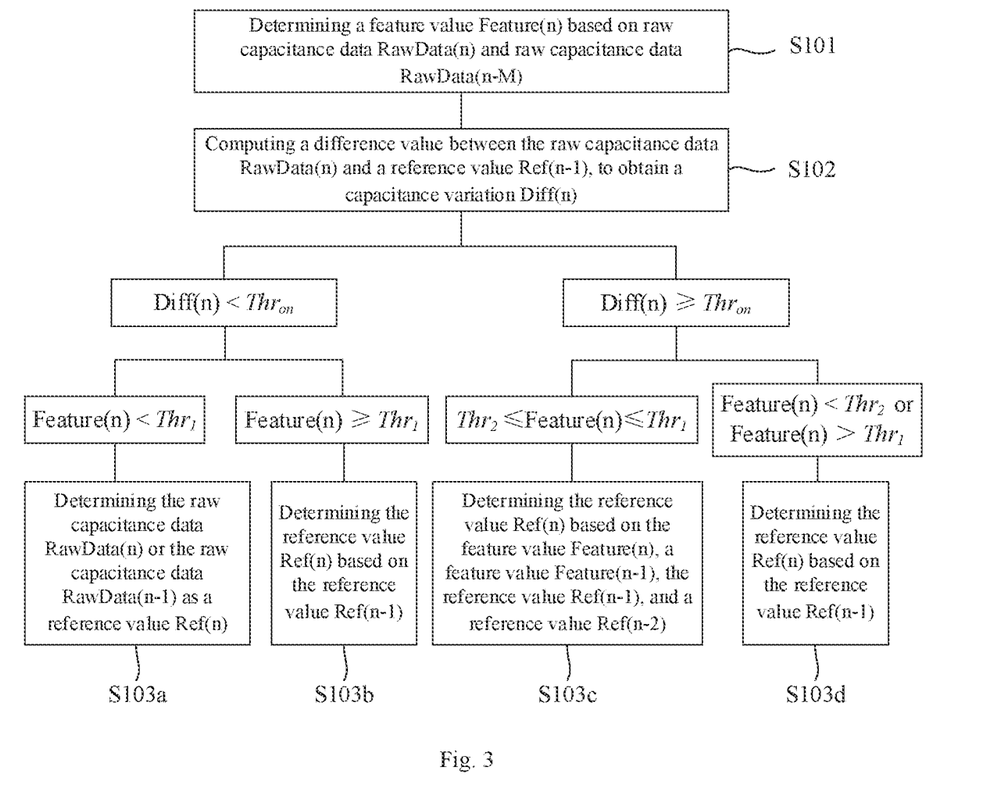
FIG. 3 is a schematic block diagram of a method for updating a capacitance reference provided in an embodiment of the present disclosure.

As shown in FIG. 3, a schematic block diagram of a method for updating a capacitance reference provided in an embodiment of the present disclosure is shown. The method may be applied to a capacitance detection apparatus, and specifically includes the following steps:

Step S101: determining, based on an n-th frame of raw capacitance data RawData(n) and an (n−M)-th frame of raw capacitance data RawData(n−M) outputted from the capacitance detection apparatus, a feature value Feature(n) corresponding to the n-th frame of raw capacitance data.

The feature value Feature(n) corresponding to the n-th frame of raw capacitance data may indicate a different stage in a process of a conductor (a human body or other conductors) approaching or moving away from the capacitance detection apparatus.

Step S102: computing a difference value between the n-th frame of raw capacitance data RawData(n) and a reference value Ref(n−1) corresponding to an (n−1)-th frame of raw capacitance data outputted from the capacitance detection apparatus, to obtain a capacitance variation Diff(n).

By setting the capacitance variation Diff(n)=RawData(n)−Ref(n−1), a capacitance variation corresponding to the n-th frame of raw capacitance data may be predicted based on the capacitance variation Diff(n), thereby determining a moving state of the conductor. Specifically, the moving state may include: having approached the capacitance detection appearance (approached state) and not approaching the capacitance detection apparatus (non-approaching state). The capacitance variation corresponding to the n-th frame of raw capacitance data is the difference value between the n-th frame of raw capacitance data RawData(n) and the corresponding reference value Ref(n) thereof, i.e., RawData(n)−Ref(n), which may be used for indicating a current capacitance variation caused by the human body or other conductors.

Step S103a: determining, when the feature value Feature(n) corresponding to the n-th frame of raw capacitance data is less than a first threshold $Thr_1$, and the capacitance variation Diff(n) is less than a proximity threshold $Thr_{on}$, the n-th frame of raw capacitance data RawData(n) or the (n−1)-th frame of raw capacitance data RawData(n−1) as a reference value Ref(n) corresponding to the n-th frame of raw capacitance data. The proximity threshold $Thr_{on}$ may be used for determining whether the conductor has approached the capacitance detection apparatus; and the first threshold $Thr_1$ may be used for determining whether there is an additional input from the conductor on the capacitance detection apparatus.

The capacitance variation Diff(n) may be compared with the proximity threshold $Thr_{on}$, to determine whether the conductor has approached the capacitance detection apparatus, i.e., determine the moving state of the conductor. Specifically, if the capacitance variation Diff(n) reaches the proximity threshold $Thr_{on}$, i.e., is greater than or equal to the proximity threshold $Thr_{on}$, it may be determined that the conductor is in the approached state; and if the capacitance variation Diff(n) does not reach the proximity threshold $Thr_{on}$, i.e., is less than the proximity threshold $Thr_{on}$, it may be determined that the conductor is in a non-approaching state. In addition, the size of the proximity threshold $Thr_{on}$ may be generated by machine learning based on training data. The training data may include, but is not limited to, a corresponding capacitance variation Diff(n) when different types of conductors come in contact with the capacitance detection apparatus to different extents and a corresponding capacitance variation Diff(n) when there are different distances between different types of conductors and the capacitance detection apparatus. In addition, the size of the proximity threshold $Thr_{on}$ may also be adjusted accordingly based on subsequent actual applications of a user, thereby more accurately distinguishing whether the human body or other conductors have approached the capacitance detection apparatus, and better adapting to different application scenarios.

Step S103b: determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data.

Step S103c: determining, when the feature value Feature(n) corresponding to the n-th frame of raw capacitance data is greater than or equal to a second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, a feature value Feature(n−1) corresponding to the (n−1)-th frame of raw capacitance data, the reference value Ref(n−1) corresponding to the (n−1)-th frame of raw capacitance data, and a reference value Ref(n−2) corresponding to an (n−2)-th frame of raw capacitance data outputted from the capacitance detection apparatus.

The second threshold $Thr_2$ is less than the first threshold $Thr_1$. The second threshold $Thr_2$ may be used for determining whether the conductor is gradually disconnected from contact with the capacitance detection apparatus, and specifically may be used for further determining whether a moving trend of the conductor in the approached state is to maintain stable contact with the capacitance detection apparatus or to start to move away from the capacitance detection apparatus.

Step S103d: determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data.

In the above, n is a positive integer greater than 2, M is a positive integer greater than or equal to 1, and M<n. When n is greater than 1 or 2, a value of Ref (1) or Ref (2) may be set to be equal to a signal value of a raw capacitance signal outputted from the capacitance detection apparatus when there is no additional input from a human body or other conductors.

Specifically, setting of the first threshold $Thr_1$ may also be generated by machine learning based on training data. The training data may include, but is not limited to: a capacitance variation when there is no additional input from a human body or other conductors on the capacitance detection apparatus, a capacitance variation when a human body or other conductors start to approach the capacitance detection apparatus, and a capacitance variation when a human body or other conductors start to move away from the capacitance detection apparatus. In addition, the second threshold $Thr_2$ may be set as a negative value, and its absolute value may be from 2 to 3 times as much as the first threshold $Thr_1$.

The feature value Feature(n) is set based on the n-th frame of raw capacitance data RawData(n) and the (n−M)-th frame of raw capacitance data RawData(n−M), the size of the feature value Feature(n) is compared with the size of a preset threshold, a process of a human body or other conductors approaching or moving away from the capacitance detection apparatus may be classified into different stages, and a corresponding capacitance reference updating approach may be set based on different moving states (approached/non-approaching) and moving trends (approaching, maintaining contact, moving away) of a conductor in each stage, thereby effectively updating the reference value in real time.

Specifically, Feature(n)<$Thr_1$ and Diff(n)<$Thr_{on}$ may indicate that there is no additional input caused by a conductor on the capacitance detection apparatus, including: no conductor starts to approach the capacitance detection apparatus, and a conductor has moved away from the capacitance detection apparatus; and the raw capacitance data RawData(n) in this stage only indicates a capacitance variation caused by an environmental noise, such that this stage may be referred to as a noise stage.

Feature(n)≥$Thr_1$ and Diff(n)<$Thr_{on}$ may indicate that a conductor is slowly/rapidly approaching the capacitance detection apparatus, but the conductor is still in a non-approaching state, such that this stage may be referred to as a pre-approaching stage.

$Thr_2$≤Feature(n)≤$Thr_1$ and Diff(n)≥$Thr_{on}$ may indicate that a conductor maintains stable contact with the capacitance detection apparatus, and has reached a most approaching state; and Feature(n)>$Thr_1$ or Feature(n)<$Thr_2$ and Diff(n)≤$Thr_{on}$ means that the conductor is in the approached state and is further approaching the capacitance detection apparatus, or is gradually disconnected from contact with the capacitance detection apparatus, i.e., starts to leave from the capacitance detection apparatus. The two stages may be referred to as an approaching stage.

As a possible implementation, the determining, based on the n-th frame of raw capacitance data RawData(n) and the (n−M)-th frame of raw capacitance data RawData(n−M) outputted from the capacitance detection apparatus, the feature value Feature(n) corresponding to the n-th frame of raw capacitance data further includes: determining a difference value between the n-th frame of raw capacitance data RawData(n) and the (n−M)-th frame of raw capacitance data RawData(n−M) as the feature value Feature(n) corresponding to the n-th frame of raw capacitance data.

Therefore, Feature(n)=RawData(n)−RawData(n−M) may be set. A value of M may be set based on an actual application scenario and to-be-achieved application objective, and may be at least 1. Further, the smaller the value of M is, the better the timeliness of the capacitor reference update is, but the higher the computing workload is.

As a possible implementation, the determining, when the feature value Feature(n) corresponding to the n-th frame of raw capacitance data is less than the first threshold $Thr_1$, and the capacitance variation Diff(n) is less than the proximity threshold $Thr_{on}$, the n-th frame of raw capacitance data RawData(n) or the (n−1)-th frame of raw capacitance data RawData(n−1) as the reference value Ref(n) corresponding to the n-th frame of raw capacitance data further includes: determining a minimum value of the n-th frame of raw capacitance data RawData(n) and the (n−1)-th frame of raw capacitance data RawData(n−1) as the reference value Ref(n) corresponding to the n-th frame of raw capacitance data.

Therefore, Ref(n)=min{RawData(n), RawData(n−1)} may be set in the noise stage. This reference updating approach may enable a noise in a capacitance variation signal Diff in this stage to merely have a one-way variation, thereby effectively reducing a noise of a reverse variation in the capacitance variation signal Diff, can reduce a noise variance in the capacitance variation signal Diff in this stage by half compared with first-order hysteresis filtering commonly used in the prior art, will not consume a valid signal component in the capacitance variation signal Diff, and in addition, may also enable the reference signal Ref to track the fluctuations of the raw capacitance signal RawData in real time, thereby reducing the impacts of noise jitter and delayed response on the capacitance detection performance.

As a possible implementation, the determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data further includes:

When the feature value Feature(n) corresponding to the n-th frame of raw capacitance data is greater than or equal to the first threshold $Thr_1$, and is less than a third threshold $Thr_3$, and the capacitance variation Diff(n) is less than the proximity threshold $Thr_{on}$, a sum of the reference value Ref(n−1) corresponding to the (n−1)-th frame of raw capacitance data and a first correction value $Corr_1$ is determined as the reference value Ref(n) corresponding to the n-th frame of raw capacitance data; and when the feature value Feature(n) corresponding to the n-th frame of raw capacitance data is greater than or equal to the third threshold $Thr_3$, and the capacitance variation Diff(n) is less than the proximity threshold $Thr_{on}$, a sum of the reference value Ref(n−1) corresponding to the (n−1)-th frame of raw capacitance data and a second correction value $Corr_2$ is determined as the reference value Ref(n) corresponding to the n-th frame of raw capacitance data. The third threshold $Thr_3$ may be used for determining an extent to which the conductor is approaching the capacitance detection apparatus, and the third threshold $Thr_3$ is greater than the first threshold $Thr_1$; and the first correction value $Corr_1$ and the second correction value $Corr_2$ may be used for characterizing an offset of a reference value caused by an environmental factor in a corresponding stage, respectively.

Therefore, in the pre-approaching stage, this reference updating approach can reduce the reference drift noise caused by an environmental factor such as temperature, improve the signal-to-noise ratio of the capacitance variation signal Diff, and update the reference signal Ref in real time, thereby reducing the impacts of noise jitter and delayed response on the capacitance detection performance.

Therefore, the pre-approaching stage may be further divided into two sub-stages, and a human body or other conductors approach the capacitance detection apparatus to different extents in the two sub-stages. Specifically, when $Thr_1$≤Feature(n)<$Thr_3$, and Diff(n)<$Thr_{on}$, Ref(n)=Ref(n−1)+$Corr_1$ is set, and this stage may be referred to as a first pre-approaching sub-stage; and when Feature(n)≥$Thr_3$ and Diff(n)<$Thr_{on}$, Ref(n)=Ref(n−1)+$Corr_2$ is set, and this stage may be referred to as a second pre-approaching sub-stage. The approaching extent in the second pre-approaching stage is higher than that in the first pre-approaching stage. Specifically, the first correction value $Corr_1$ may be set to be about 20% of the proximity threshold $Thr_{on}$, and the second correction value $Corr_2$ may be set to be equal to the first correction value $Corr_1$ or slightly smaller than the first correction value $Corr_1$. The third threshold $Thr_3$ may be set as an opposite number of the second threshold $Thr2$, i.e., 2 to 3 times as much as the first threshold $Thr_1$.

As a possible implementation, the determining, when the feature value Feature(n) corresponding to the n-th frame of raw capacitance data is greater than or equal to the second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, the feature value Feature(n−1) corresponding to the (n−1)-th frame of raw capacitance data, the reference value Ref(n−1) corresponding to the (n−1)-th frame of raw capacitance data, and the reference value Ref(n−2) corresponding to the (n−2)-th frame of raw capacitance data outputted from the capacitance detection apparatus further includes:

computing a difference value between the feature value Feature(n) corresponding to the n-th frame of raw capacitance data and the feature value Feature(n−1) corresponding to the (n−1)-th frame of raw capacitance data, to obtain a first variation Diff_Feature(n); computing a difference value between the reference value Ref(n−1) corresponding to the (n−1)-th frame of raw capacitance data and the reference value Ref(n−2) corresponding to the (n−2)-th frame of raw capacitance data outputted from the capacitance detection apparatus, to obtain a second variation Diff-Ref(n−1); and enabling the reference value Ref(n) corresponding to the n-th frame of raw capacitance data to satisfy an equation below:

$$Ref(n) = \left(\frac{Diff\_Feature(n)}{Feature(n-1)} + 1\right) * Diff\_Ref(n-1).$$

The second variation Diff_Ref(n−1)≠0. If in this stage, Ref(n−1) is equal to Ref(n−2), the second variation Diff_Ref (n−1) may be set as a non-zero constant value, for example, may be set to be equal to a value of a non-zero second variation Diff_Ref(n−1) in a previous frame.

In this stage, the conductor steadily maintains contact with the capacitance detection apparatus, and is in the most approaching state. The conductor generally shakes to a certain extent or has a temperature difference from a sensor in the capacitance detection apparatus, which tends to cause abnormal jitter variation of the raw capacitance signal RawData, further makes the capacitance variation signal Diff have an obvious noise component, and affects the accuracy of the capacitance detection result, while the updating the capacitance reference value in real time by the above approach can extract the jitter variation in the raw capacitance signal RawData in a process of the conductor maintaining continuous and stable contact with the capacitance detection apparatus, and superimpose the jitter variation to the reference signal Ref, thereby reducing low-frequency noise in the capacitance variation signal Diff, and effectively reducing the probability of misrecognition or missed recognition of an event.

As a possible implementation, the determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data further includes:

determining, when the feature value Feature(n) corresponding to the n-th frame of raw capacitance data is greater than the first threshold $Thr_1$, and the capacitance variation Diff(n) is greater than or equal to the proximity threshold $Thr_{on}$, the sum of the reference value Ref(n−1) corresponding to the (n−1)-th frame of raw capacitance data and the second correction value $Corr_2$ as the reference value Ref(n) corresponding to the n-th frame of raw capacitance data; and determining, when the feature value Feature(n) corresponding to the n-th frame of raw capacitance data is less than the second threshold $Thr_2$, and the capacitance variation Diff(n) is greater than or equal to the proximity threshold $Thr_{on}$, a sum of the reference value Ref(n−1) corresponding to the (n−1)-th frame of raw capacitance data and a third correction value $Corr_3$ as the reference value Ref(n) corresponding to the n-th frame of raw capacitance data.

The third correction value $Corr_3$ may be used for characterizing an offset of a reference value caused by an environmental factor in a corresponding stage. Specifically, the third correction value Corr3 may be set based on an actual application scenario, and may be equal to the first correction value $Corr_1$ and the second correction value $Corr_2$, or slightly smaller than the first correction value $Corr_1$.

Therefore, this stage may be further divided into two sub-stages. Feature(n)>$Thr_1$ and Diff(n)≥$Thr_{on}$ means that the conductor is in an approached state and is further approaching the capacitance detection apparatus. Ref(n) =Ref(n−1)+$Corr_2$ is set to ensure that the signal value of the reference signal Ref in this stage is continuous with the signal value in the last stage (the second pre-approaching sub-stage). Feature(n)<$Thr_2$ and Diff(n)≥$Thr_{on}$ means that the conductor is in the approached state, but is gradually disconnected from contact with the capacitance detection apparatus, i.e., starts to leave from the capacitance detection apparatus. Ref(n)=Ref (n−1)+$Corr_3$ is set to ensure that the reference signal Ref can be promptly updated in real time following the raw capacitance signal RawData.

In this stage, the above reference updating approach can reduce the reference drift noise caused by an environmental factor such as temperature, improve the signal-to-noise ratio of the capacitance variation signal Diff, and enable the reference signal Ref to promptly track the variation of the raw capacitance signal RawData in real time, thereby reducing the impacts of noise jitter and delayed response on the capacitance detection performance.

Figure 4:
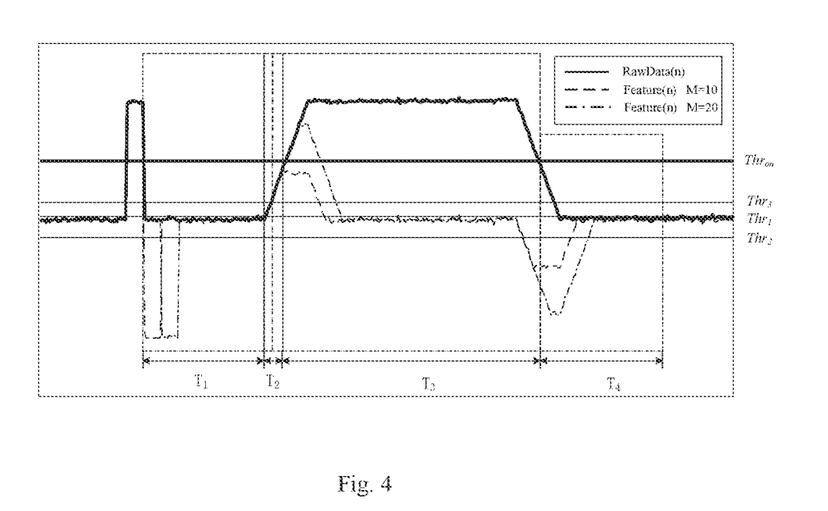
FIG. 4 is a schematic fluctuation diagram of a raw capacitance signal and a feature signal in a process of a conductor approaching and moving away provided in an embodiment of the present disclosure.

As shown in FIG. 4, a schematic fluctuation diagram of a raw capacitance signal and a feature signal in a process of a conductor approaching and moving away provided in an embodiment of the present disclosure is shown. It can be seen that by comparing the Feature(n) with the first threshold $Thr_1$, the second threshold $Thr_2$, and the third threshold $Thr_3$, the process of the conductor approaching and moving away from a capacitance detection apparatus may be divided into different stages, including a noise stage ($T_1$ and $T_4$), a pre-approaching stage ($T_2$), and an approaching stage ($T_3$), where, in the $T_1$ period of the noise stage, there is no additional input from the conductor on the capacitance detection apparatus, and in the $T_4$ period of the noise stage, the conductor has moved away from the capacitor detection apparatus; and the pre-approaching stage may be further divided into two sub-stages based on different approaching extents, and the approaching stage may be further divided into three sub-stages based on different moving trends. In addition, it can be seen that a feature signal Feature corresponding to M=10 has a smaller delayed response than a feature signal Feature corresponding to M=20.

Figure 5:
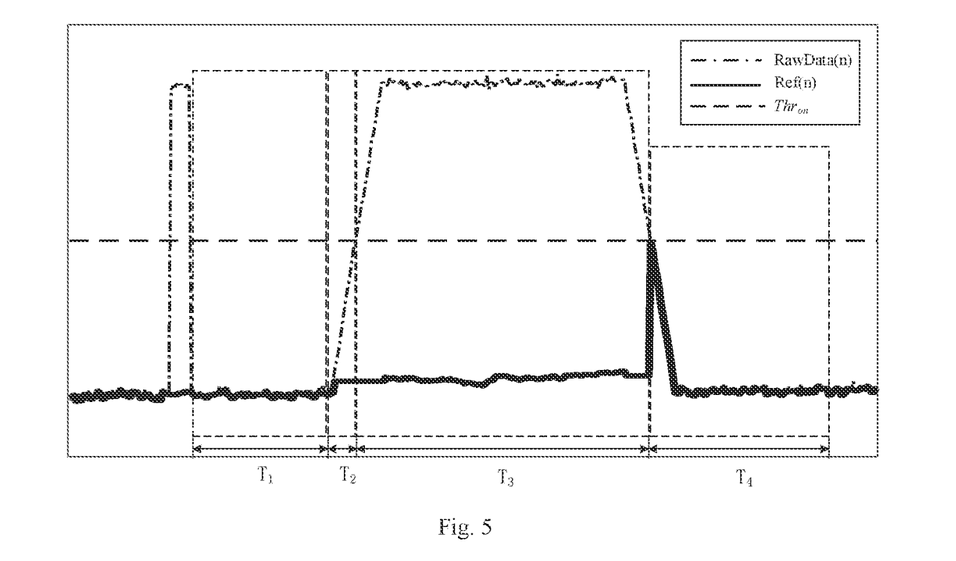
FIG. 5 is a schematic diagram of updating a reference signal in a process of a conductor approaching and moving away provided in an embodiment of the present disclosure.

As shown in FIG. 5, a schematic diagram of updating a reference signal in a process of a conductor approaching and moving away provided in an embodiment of the present disclosure is shown; where the method for updating a capacitance reference provided in the above embodiments is used respectively in each stage of the conductor approaching and moving away from a capacitance detection apparatus. It can be seen that in $T_1$ period (noise stage), there is no additional input from a human body or other conductors on the capacitance detection apparatus, and a reference signal Ref can be updated in real time to track the variation of a raw capacitance signal RawData; in $T_2$ period (pre-approaching stage), a human body or other conductors are approaching the capacitance detection apparatus, but are still in a non-approaching state, and the reference signal Ref can track rise and variation of the raw capacitance signal RawData in time and update the raw capacitance signal in real time; in $T_3$ period (approaching stage), when a human body or other conductors are in an approached state and maintain stable contact with the capacitance detection apparatus, the reference signal Ref can also track the jitter variation of the raw capacitance signal RawData in real time, effectively reduce a low-frequency noise component in the capacitance variation signal Diff, and improve the signal-to-noise ratio of the capacitance variation signal Diff, thereby improving the accuracy of the capacitance detection result; and when the human body or other conductors are in an approached state and are further approaching the capacitance detection apparatus or are gradually disconnected from contact with the capacitance detection apparatus, the reference signal Ref can update the raw capacitance signal RawData in real time based on the variation; and in $T_4$ period (noise stage), the human body or other conductors have moved away from the capacitance detection apparatus, the reference signal Ref can be quickly updated and quickly restored to a regular reference level, thereby reducing the impacts of delayed response on the sensitivity and accuracy of subsequent capacitance detection.

Figure 6:
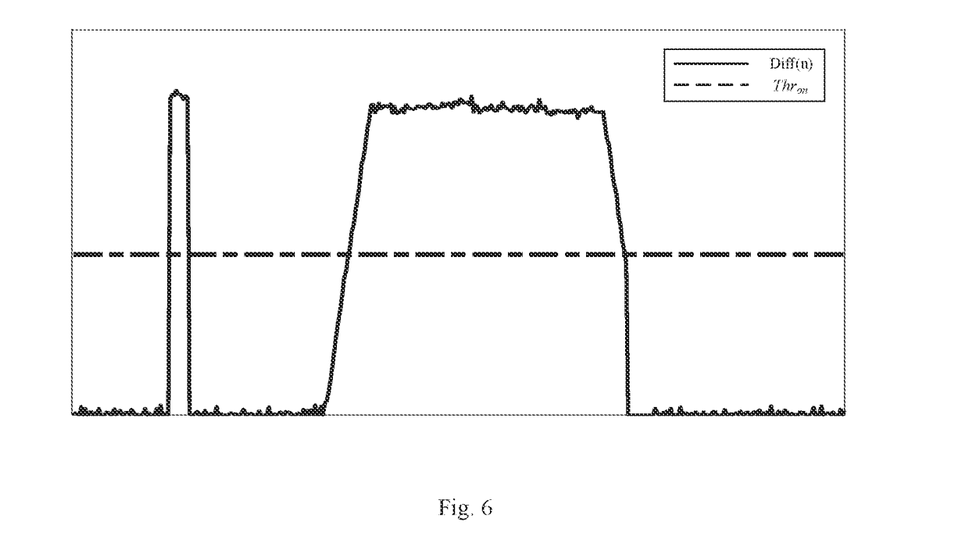
FIG. 6 is a schematic fluctuation diagram of a capacitance variation signal in a process of a conductor approaching and moving away provided in an embodiment of the present disclosure.

As shown in FIG. 6, a schematic fluctuation diagram of a capacitance variation signal in a process of a conductor approaching and moving away provided in an embodiment of the present disclosure is shown, where the method for updating a capacitance reference provided in the above embodiments is used respectively in each stage of the conductor rapidly/slowly approaching and moving away from a capacitance detection apparatus. It can be seen that in the process of a human body or other conductors are rapidly/slowly approaching and moving away from the capacitance detection apparatus, the capacitance variation signal can quickly reach a target level, and can accurately reflect whether the human body or other conductors are approaching the capacitance detection apparatus in real time, thereby improving the sensitivity and accuracy of capacitance detection.

In a practical application, it is often necessary to accurately recognize the process of a human body or other conductors slowly approaching and rapidly moving away in real time. Therefore, the method for updating a capacitance reference provided in the embodiments of the present disclosure can be well adapted to this application scenario.

It should be noted that in order to adapt to sizes of different thresholds, a proportional coefficient of a feature value Feature(n) corresponding to an n-th frame of raw capacitance data may be scaled accordingly. For example, Feature(n)=[RawData(n)−RawData(nM)]*a may be set, where a may be a constant greater than 0, such that a value of Feature(n) corresponds to the size of a preset threshold, to effectively distinguish between different stages in the process of the conductor approaching or moving away from the capacitance detection apparatus, and different reference updating methods are set for different stages to effectively update the reference value in real time, thereby reducing the impacts of noise jitter and delayed response on the capacitance detection performance, improving the accuracy of the capacitance detection result, and reducing the probability of misrecognition or missed recognition of an event.

The method for updating a capacitance reference provided in the embodiments of the present disclosure can be adapted to various scenarios where accurate detection of capacitance is required, including wearing detection, touch detection, SAR (Specific Absorption Rate) application, and the like. For example, in an ear detection application of a Bluetooth headset (such as a TWS earbud), the method can accurately identify whether a user has worn the Bluetooth headset.

Figure 7:
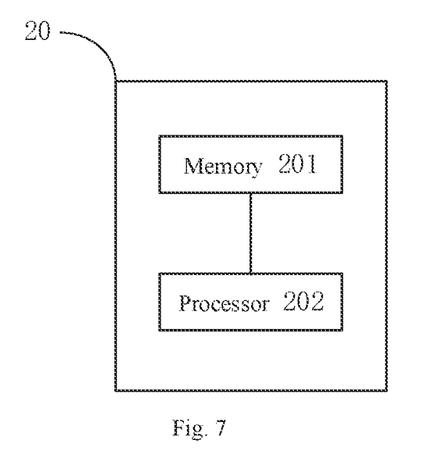
FIG. 7 is a schematic structural diagram of a chip provided in an embodiment of the present disclosure.

As shown in FIG. 7, a schematic structural diagram of a chip provided in an embodiment of the present disclosure is shown. A chip 20 includes a memory 201 and a processor 202; where the memory 201 may store computer program instructions, and the processor 202 may invoke the computer program instructions stored in the memory 201, such that the chip 20 may execute the method for updating a capacitor reference provided in the first aspect or any one of the possible implementations in the first aspect described above.

Specifically, the memory 201 may be a volatile memory (VM) such as a random access memory (RAM), or a non-volatile memory (NVM) such as a hard disk drive (HDD) or a solid state drive (SSD), or a circuit or any other apparatus capable of realizing storage functions. The memory 201 is, and is not limited to, any other medium that may store or carry desired program codes in the form of instructions or data structures and can be accessed by a computer.

The processor 202 may be, and is not limited to, a general purpose processor (such as a microprocessor), a digital signal processor, an application specific integrated circuit, a transistor logic device, a field programmable gate array, or other programmable logic devices, and may implement or execute the methods, steps, and logic block diagrams provided in the embodiments of the present disclosure. The methods and steps provided in the embodiments of the present disclosure may be directly embodied as being executed and completed by a hardware processor, or being executed and completed by a combination of hardware and software modules in the processor.

The chip 20 may also be referred to as a system chip, a system-on-chip, and so on.

In a third aspect, an embodiment of the present disclosure provides a capacitance detection apparatus, including the chip as provided in the above second aspect.

The capacitance detection apparatus may execute the method for updating a capacitance reference provided in the first aspect or any one of the possible implementations in the first aspect described above.

In a fourth aspect, an embodiment of the present disclosure provides a computer readable storage medium that may store a computer program, where the computer program may cause a computer to execute the method for updating a capacitance reference provided in the first aspect or any one of the possible implementations in the first aspect described above.

The computer readable storage medium may be any available medium accessible to the computer, or may be a data storage device, such as a server or a data center, integrated with one or more available mediums. The available medium may be, and is not limited to, a magnetic medium (such as a hard disk drive, a floppy disk, or a magnetic tape), a semiconductor medium (such as a solid state drive), or an optical medium (such as a digital video disk (DVD).

The methods provided in the embodiments of the present application may be implemented completely or partially by software, hardware, firmware, or any combination thereof, and when implemented by software, may be implemented completely or partially in the form of a computer program product, where the computer program product includes one or more computer instructions. When the computer instructions are loaded and executed on a computer, the processes or functions described according to the embodiments of the present disclosure may be generated completely or partially; the computer may be a general purpose computer, a special purpose computer, a computer network, a network device, a user device, or other programmable apparatuses; and the computer instructions may be stored in a computer readable storage medium, or transmitted from one computer readable storage medium to another computer readable storage medium, for example, the computer instructions may be transmitted from a computer, server, website, or data center to another computer, server, website, or data center by wired transmission (such as light, coaxial cable, or digital subscriber line (DSL)) or wireless transmission (such as microwave, millimeter wave, or infrared).

It should be understood that the specific implementations in the embodiments of the present disclosure are provided only to help those skilled in the art to better understand the embodiments of the present disclosure, rather than limiting the scope of the embodiments of the present disclosure. Those skilled in the art may make various improvements and modifications on the basis of the above embodiments, and these improvements or modifications all fall into the scope of protection of the present disclosure.

What is claimed is:

1. A method for updating a capacitance reference, being applied to a capacitance detection apparatus, the method comprising:

determining, based on an n-th frame of raw capacitance data RawData(n) and an (n−M)-th frame of raw capacitance data RawData(n−M) outputted from the capacitance detection apparatus, a feature value Feature(n) corresponding to the n-th frame of raw capacitance data; where the feature value Feature(n) corresponding to the n-th frame of raw capacitance data is used for indicating a different stage in a process of a conductor approaching or moving away from the capacitance detection apparatus;

computing a difference value between the n-th frame of raw capacitance data RawData(n) and a reference value Ref(n−1) corresponding to an (n−1)-th frame of raw capacitance data outputted from the capacitance detection apparatus, to obtain a capacitance variation Diff(n); and determining, when the feature value Feature(n) corresponding to the n-th frame of raw capacitance data is less than a first threshold $Thr_1$, and the capacitance variation Diff(n) is less than a proximity threshold $Thr_{on}$, the n-th frame of raw capacitance data RawData(n) or the (n−1)-th frame of raw capacitance data RawData(n−1) as a reference value Ref(n) corresponding to the n-th frame of raw capacitance data; where the proximity threshold $Thr_{on}$ is used for determining whether the conductor has approached the capacitance detection apparatus; and the first threshold $Thr_1$ is used for determining whether there is an additional input from the conductor on the capacitance detection apparatus;

wherein n is a positive integer greater than 2, M is a positive integer greater than or equal to 1, and M<n.

2. The method according to claim 1, wherein the method further comprises:

determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data.

3. The method according to claim 2, wherein the method further comprises:

determining, when the feature value Feature(n) corresponding to the n-th frame of raw capacitance data is greater than or equal to a second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, a feature value Feature(n−1) corresponding to the (n−1)-th frame of raw capacitance data, the reference value Ref(n−1) corresponding to the (n−1)-th frame of raw capacitance data, and a reference value Ref(n−2) corresponding to an (n−2)-th frame of raw capacitance data outputted from the capacitance detection apparatus; wherein the second threshold $Thr_2$ is used for determining whether the conductor is gradually disconnected from contact with the capacitance detection apparatus;

wherein the second threshold $Thr_2$ is less than the first threshold $Thr_1$.

4. The method according to claim 3, wherein the method further comprises:

determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data.

5. The method according to claim 1, wherein the determining, based on the n-th frame of raw capacitance data RawData(n) and the (n−M)-th frame of raw capacitance data RawData(n−M) outputted from the capacitance detection apparatus, the feature value Feature(n) corresponding to the n-th frame of raw capacitance data further comprises:

determining a difference value between the n-th frame of raw capacitance data RawData(n) and the (n−M)-th frame of raw capacitance data RawData(n−M) as the feature value Feature(n) corresponding to the n-th frame of raw capacitance data.

6. The method according to claim 5, wherein the determining, when the feature value Feature(n) corresponding to the n-th frame of raw capacitance data is less than the first threshold $Thr_1$, and the capacitance variation Diff(n) is less than the proximity threshold $Thr_{on}$, the n-th frame of raw capacitance data RawData(n) or the (n−1)-th frame of raw capacitance data RawData(n−1) as the reference value Ref(n) corresponding to the n-th frame of raw capacitance data further comprises:

determining a minimum value of the n-th frame of raw capacitance data RawData(n) and the (n−1)-th frame of raw capacitance data RawData(n−1) as the reference value Ref(n) corresponding to the n-th frame of raw capacitance data.

7. The method according to claim 6, wherein the determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data further comprises:

determining, when the feature value Feature(n) corresponding to the n-th frame of raw capacitance data is greater than or equal to the first threshold $Thr_1$, and is less than a third threshold $Thr_3$, and the capacitance variation Diff(n) is less than the proximity threshold $Thr_{on}$, a sum of the reference value Ref(n−1) corresponding to the (n−1)-th frame of raw capacitance data and a first correction value $Corr_1$ as the reference value Ref(n) corresponding to the n-th frame of raw capacitance data;

determining, when the feature value Feature(n) corresponding to the n-th frame of raw capacitance data is greater than or equal to the third threshold $Thr_3$, and the capacitance variation Diff(n) is less than the proximity threshold $Thr_{on}$, a sum of the reference value Ref(n−1) corresponding to the (n−1)-th frame of raw capacitance data and a second correction value $Corr_2$ as the reference value Ref(n) corresponding to the n-th frame of raw capacitance data; wherein the third threshold $Thr_3$ is used for determining an extent to which the conductor is approaching the capacitance detection apparatus; and     the first correction value $Corr_1$ and the second correction value $Corr_2$ are used for characterizing an offset of a reference value caused by an environmental factor in a corresponding stage, respectively;

wherein the third threshold $Thr_3$ is greater than the first threshold $Thr_1$.

8. The method according to claim 7, wherein the determining, when the feature value Feature(n) corresponding to the n-th frame of raw capacitance data is greater than or equal to the second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, the feature value Feature(n−1) corresponding to the (n−1)-th frame of raw capacitance data, the reference value Ref(n−1) corresponding to the (n−1)-th frame of raw capacitance data, and the reference value Ref(n−2) corresponding to the (n−2)-th frame of raw capacitance data outputted from the capacitance detection apparatus further comprises:

computing a difference value between the feature value Feature(n) corresponding to the n-th frame of raw capacitance data and the feature value Feature(n−1) corresponding to the (n−1)-th frame of raw capacitance data, to obtain a first variation Diff_Feature(n);

computing a difference value between the reference value Ref(n−1) corresponding to the (n−1)-th frame of raw capacitance data and the reference value Ref(n−2) corresponding to the (n−2)-th frame of raw capacitance data, to obtain a second variation Diff-Ref(n−1); and     enabling the reference value Ref(n) corresponding to the n-th frame of raw capacitance data to satisfy an equation below:

$$Ref(n) = \left( \frac{\text{Diff\_Feature}(n)}{\text{Feature}(n-1)} + 1 \right) * \text{Diff\_Ref}(n-1)$$

wherein a value of the second variation Diff_Ref(n−1) is not zero.

9. The method according to claim 8, wherein the determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data further comprises:

determining, when the feature value Feature(n) corresponding to the n-th frame of raw capacitance data is greater than the first threshold $Thr_1$, and the capacitance variation Diff(n) is greater than or equal to the proximity threshold $Thr_{on}$, the sum of the reference value Ref(n−1) corresponding to the (n−1)-th frame of raw capacitance data and the second correction value $Corr_2$ as the reference value Ref(n) corresponding to the n-th frame of raw capacitance data; and     determining, when the feature value Feature(n) corresponding to the n-th frame of raw capacitance data is less than the second threshold $Thr_2$, and the capacitance variation Diff(n) is greater than or equal to the proximity threshold $Thr_{on}$, a sum of the reference value Ref(n−1) corresponding to the (n−1)-th frame of raw capacitance data and a third correction value $Corr_3$ as the reference value Ref(n) corresponding to the n-th frame of raw capacitance data;

wherein the third correction value $Corr_3$ is used for characterizing an offset of a reference value caused by an environmental factor in a corresponding stage.

10. The method according to claim 3, the second threshold $Thr_2$ is used for further determining whether a moving trend of the conductor in the approached state is to maintain stable contact with the capacitance detection apparatus or to start to move away from the capacitance detection apparatus.

11. A capacitance detection apparatus, comprising: a processor and a memory, the memory being coupled to the processor; wherein     the memory is configured to store computer program instructions; and     the processor is configured to invoke the computer program instructions stored in the memory, such that the capacitance detection apparatus executes a method for updating a capacitance reference, the method comprising:

determining, based on an n-th frame of raw capacitance data RawData(n) and an (n−M)-th frame of raw capacitance data RawData(n−M) outputted from the capacitance detection apparatus, a feature value Feature(n) corresponding to the n-th frame of raw capacitance data; where the feature value Feature(n) corresponding to the n-th frame of raw capacitance data is used for indicating a different stage in a process of a conductor approaching or moving away from the capacitance detection apparatus;

computing a difference value between the n-th frame of raw capacitance data RawData(n) and a reference value Ref(n−1) corresponding to an (n−1)-th frame of raw capacitance data outputted from the capacitance detection apparatus, to obtain a capacitance variation Diff(n); and determining, when the feature value Feature(n) corresponding to the n-th frame of raw capacitance data is less than a first threshold $Thr_1$, and the capacitance variation Diff(n) is less than a proximity threshold $Thr_{on}$, the n-th frame of raw capacitance data RawData(n) or the (n−1)-th frame of raw capacitance data RawData(n−1) as a reference value Ref(n) corresponding to the n-th frame of raw capacitance data; where the proximity threshold $Thr_{on}$ is used for determining whether the conductor has approached the capacitance detection apparatus; and the first threshold $Thr_1$ is used for determining whether there is an additional input from the conductor on the capacitance detection apparatus;

wherein n is a positive integer greater than 2, M is a positive integer greater than or equal to 1, and M<n.

12. The capacitance detection apparatus according to claim 11, further comprising:

determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data.

13. The capacitance detection apparatus according to claim 12, further comprising:

determining, when the feature value Feature(n) corresponding to the n-th frame of raw capacitance data is greater than or equal to a second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, a feature value Feature(n−1) corresponding to the (n−1)-th frame of raw capacitance data, the reference value Ref(n−1) corresponding to the (n−1)-th frame of raw capacitance data, and a reference value Ref(n−2) corresponding to an (n−2)-th frame of raw capacitance data outputted from the capacitance detection apparatus; wherein the second threshold $Thr_2$ is used for determining whether the conductor is gradually disconnected from contact with the capacitance detection apparatus;

wherein the second threshold $Thr_2$ is less than the first threshold $Thr_1$.

14. The capacitance detection apparatus according to claim 13, further comprising:

determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data.

15. The capacitance detection apparatus according to claim 11, wherein the determining, based on the n-th frame of raw capacitance data RawData(n) and the (n−M)-th frame of raw capacitance data RawData(n−M) outputted from the capacitance detection apparatus, the feature value Feature(n) corresponding to the n-th frame of raw capacitance data further comprises:

determining a difference value between the n-th frame of raw capacitance data RawData(n) and the (n−M)-th frame of raw capacitance data RawData(n−M) as the feature value Feature(n) corresponding to the n-th frame of raw capacitance data.

16. The capacitance detection apparatus according to claim 15, wherein the determining, when the feature value Feature(n) corresponding to the n-th frame of raw capacitance data is less than the first threshold $Thr_1$, and the capacitance variation Diff(n) is less than the proximity threshold $Thr_{on}$, the n-th frame of raw capacitance data RawData(n) or the (n−1)-th frame of raw capacitance data RawData(n−1) as the reference value Ref(n) corresponding to the n-th frame of raw capacitance data further comprises:

determining a minimum value of the n-th frame of raw capacitance data RawData(n) and the (n−1)-th frame of raw capacitance data RawData(n−1) as the reference value Ref(n) corresponding to the n-th frame of raw capacitance data.

17. The capacitance detection apparatus according to claim 16, wherein the determining, when the feature value Feature(n) corresponding to the n-th frame of raw capacitance data is greater than or equal to the first threshold $Thr_1$, and the capacitance variation Diff(n) is less than the proximity threshold $Thr_{on}$, the reference value Ref(n) corresponding to the n-th frame of raw capacitance data based on the reference value Ref(n−1) corresponding to the (n−1)-th frame of raw capacitance data further comprises:

determining, when the feature value Feature(n) corresponding to the n-th frame of raw capacitance data is greater than or equal to the first threshold $Thr_1$, and is less than a third threshold $Thr_3$, and the capacitance variation Diff(n) is less than the proximity threshold $Thr_{on}$, a sum of the reference value Ref(n−1) corresponding to the (n−1)-th frame of raw capacitance data and a first correction value $Corr_1$ as the reference value Ref(n) corresponding to the n-th frame of raw capacitance data;

determining, when the feature value Feature(n) corresponding to the n-th frame of raw capacitance data is greater than or equal to the third threshold $Thr_3$, and the capacitance variation Diff(n) is less than the proximity threshold $Thr_{on}$, a sum of the reference value Ref(n−1) corresponding to the (n−1)-th frame of raw capacitance data and a second correction value $Corr_2$ as the reference value Ref(n) corresponding to the n-th frame of raw capacitance data; wherein the third threshold $Thr_3$ is used for determining an extent to which the conductor is approaching the capacitance detection apparatus; and the first correction value $Corr_1$ and the second correction value $Corr_2$ are used for characterizing an offset of a reference value caused by an environmental factor in a corresponding stage, respectively;

wherein the third threshold $Thr_3$ is greater than the first threshold $Thr_1$.

18. The capacitance detection apparatus according to claim 17, wherein the determining, when the feature value Feature(n) corresponding to the n-th frame of raw capacitance data is greater than or equal to the second threshold $Thr_2$, and is less than or equal to the first threshold $Thr_1$, and the capacitance variation Diff(n) is greater than or equal to the proximity threshold $Thr_{on}$, the reference value Ref(n) corresponding to the n-th frame of raw capacitance data based on the feature value Feature(n) corresponding to the n-th frame of raw capacitance data, the feature value Feature(n−1) corresponding to the (n−1)-th frame of raw capacitance data, the reference value Ref(n−1) corresponding to the (n−1)-th frame of raw capacitance data, and the reference value Ref(n−2) corresponding to the (n−2)-th frame of raw capacitance data outputted from the capacitance detection apparatus further comprises:
- computing a difference value between the feature value Feature(n) corresponding to the n-th frame of raw capacitance data and the feature value Feature(n−1) corresponding to the (n−1)-th frame of raw capacitance data, to obtain a first variation Diff_Feature(n);
- computing a difference value between the reference value Ref(n−1) corresponding to the (n−1)-th frame of raw capacitance data and the reference value Ref(n−2) corresponding to the (n−2)-th frame of raw capacitance data, to obtain a second variation Diff_Ref(n−1); and
- enabling the reference value Ref(n) corresponding to the n-th frame of raw capacitance data to satisfy an equation below:

$$Ref(n) = \left(\frac{\text{Diff\_Feature}(n)}{\text{Feature}(n-1)} + 1\right) * \text{Diff\_Ref}(n-1)$$

wherein a value of the second variation Diff_Ref(n−1) is not zero.

19. The capacitance detection apparatus according to claim 18, wherein the determining, when the feature value Feature(n) corresponding to the n-th frame of raw capacitance data is less than the second threshold $Thr_2$ or greater than the first threshold $Thr_1$, and the capacitance variation Diff(n) is greater than or equal to the proximity threshold $Thr_{on}$, the reference value Ref(n) corresponding to the n-th frame of raw capacitance data based on the reference value Ref(n−1) corresponding to the (n−1)-th frame of raw capacitance data further comprises:
- determining, when the feature value Feature(n) corresponding to the n-th frame of raw capacitance data is greater than the first threshold $Thr_1$, and the capacitance variation Diff(n) is greater than or equal to the proximity threshold $Thr_{on}$, the sum of the reference value Ref(n−1) corresponding to the (n−1)-th frame of raw capacitance data and the second correction value $Corr_2$ as the reference value Ref(n) corresponding to the n-th frame of raw capacitance data; and
- determining, when the feature value Feature(n) corresponding to the n-th frame of raw capacitance data is less than the second threshold $Thr_2$, and the capacitance variation Diff(n) is greater than or equal to the proximity threshold $Thr_{on}$, a sum of the reference value Ref(n−1) corresponding to the (n−1)-th frame of raw capacitance data and a third correction value $Corr_3$ as the reference value Ref(n) corresponding to the n-th frame of raw capacitance data;
- wherein the third correction value Corrs is used for characterizing an offset of a reference value caused by an environmental factor in a corresponding stage.

20. The capacitance detection apparatus according to claim 13, the second threshold $Thr_2$ is used for further determining whether a moving trend of the conductor in the approached state is to maintain stable contact with the capacitance detection apparatus or to start to move away from the capacitance detection apparatus.

* * * * *